(12) United States Patent
Hayakawa

(10) Patent No.: US 6,500,017 B2
(45) Date of Patent: Dec. 31, 2002

(54) SOCKET FOR ELECTRICAL PARTS WITH GUIDE WALL SECTION TO KEEP LEVER MEMBERS FROM COMING OFF

(75) Inventor: Kenji Hayakawa, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 09/880,935

(22) Filed: Jun. 15, 2001

(65) Prior Publication Data
US 2001/0055902 A1 Dec. 27, 2001

(30) Foreign Application Priority Data
Jun. 19, 2000 (JP) ....................... 2000-183374

(51) Int. Cl.[7] ............................................. H01R 11/22
(52) U.S. Cl. ...................................................... 439/268
(58) Field of Search ............................ 439/268, 266, 439/263, 264, 259

(56) References Cited

U.S. PATENT DOCUMENTS 5,186,642 A * 2/1993 Matsuoka et al. .......... 439/266
5,462,446 A * 10/1995 Ikeya ......................... 439/264
5,800,194 A * 9/1998 Yamagishi ................. 439/266
6,139,348 A * 10/2000 Fukunaga ................. 439/266

* cited by examiner

Primary Examiner—Javaid Nasri
(74) Attorney, Agent, or Firm—Staas & Halsey LLP

(57) ABSTRACT

In a socket for electrical parts having a socket body, a number of contact pins contacting a number of terminals of an electrical part is arranged on the socket body in which the electrical part is accommodated, an operation member is provided for the socket body to be vertically movable in an installed state, and when the operation member is vertically moved, a movable member is moved through lever members to thereby displace the contact pins to be electrically contacted to or separated from the terminals of the electrical part. The socket body is formed with boss portions to which base end portions of the lever members are secured to be rotatable and the socket body is formed with guide wall sections so as to guide side portions of the base end portions of the lever members to thereby prevent the lever members from coming off from the boss portions.

13 Claims, 11 Drawing Sheets

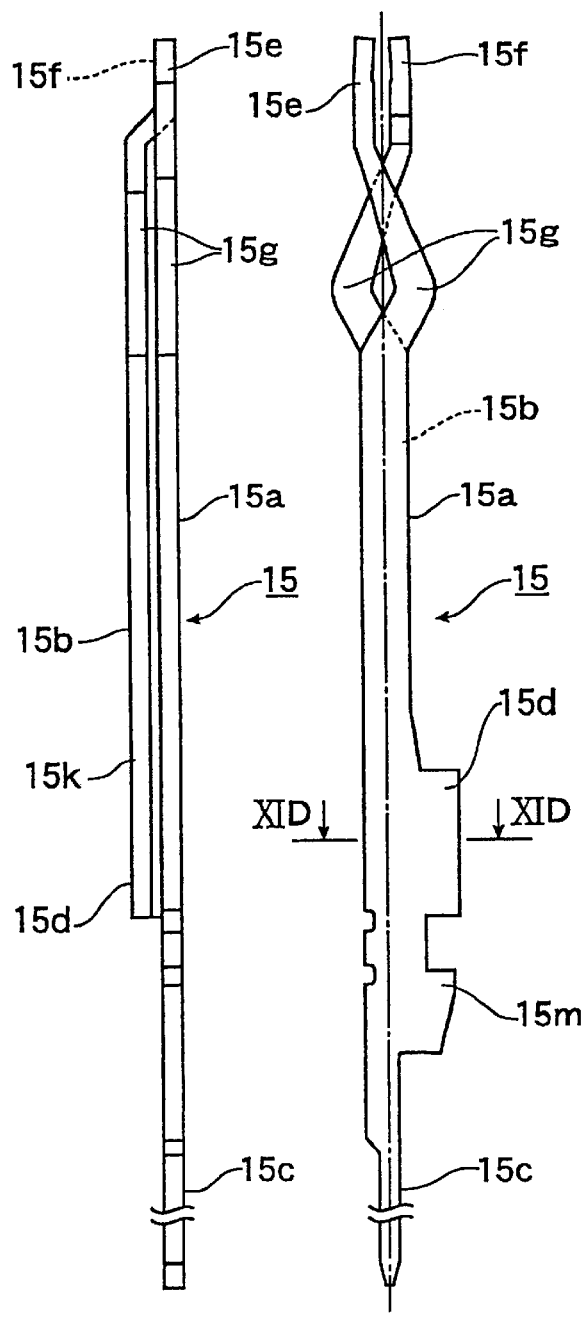

FIG.12A
FIG.12B
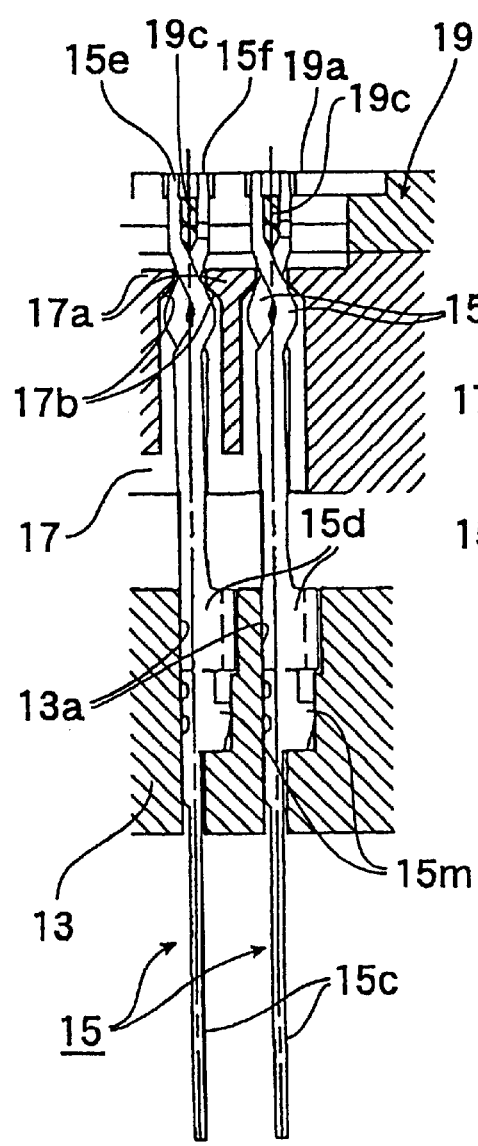
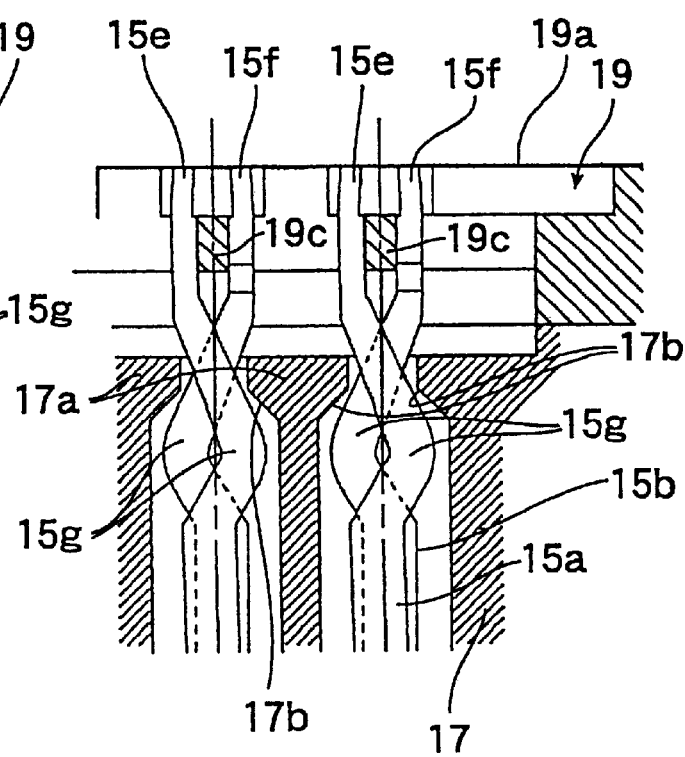

FIG.13A
FIG.13B
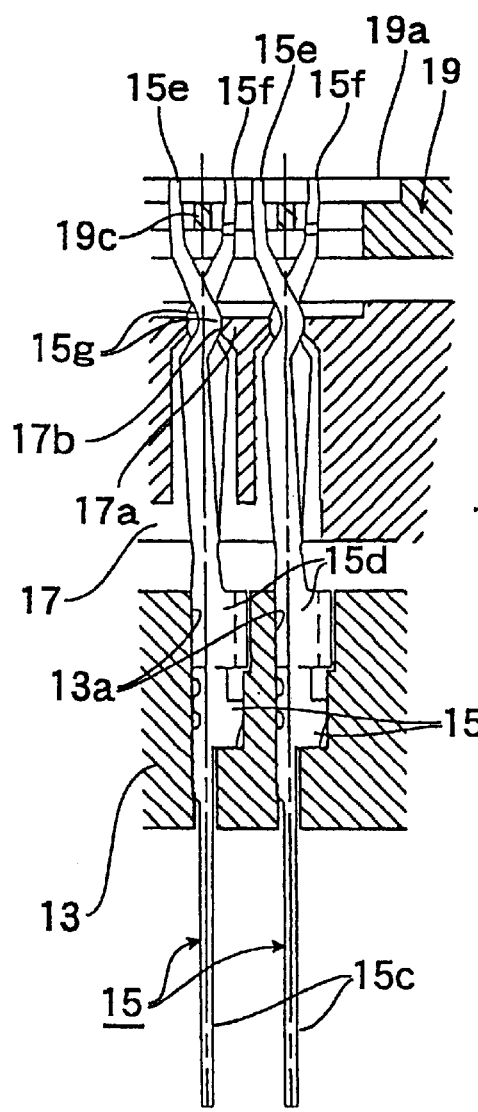
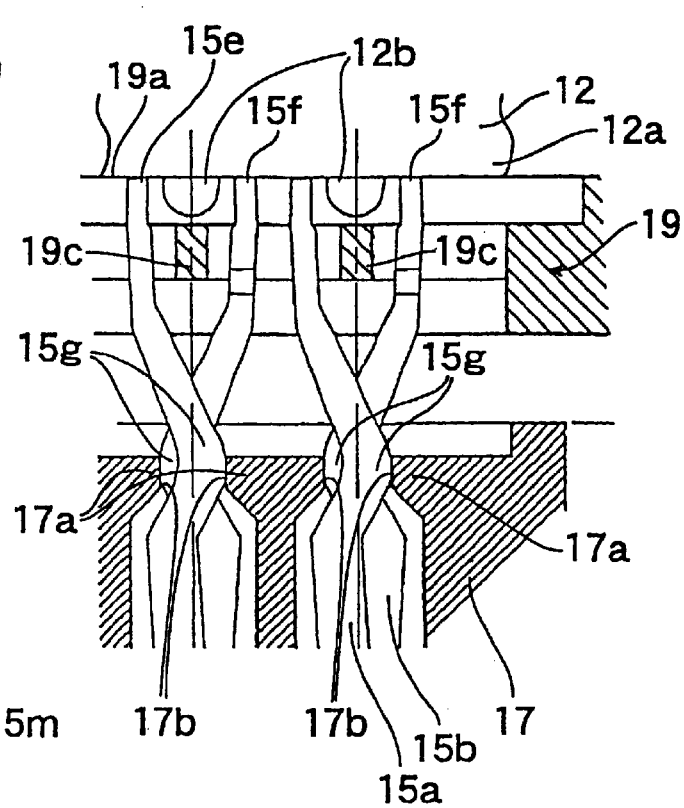

SOCKET FOR ELECTRICAL PARTS WITH GUIDE WALL SECTION TO KEEP LEVER MEMBERS FROM COMING OFF

BACKGROUND OF THE INVENTION

The present invention relates to a socket for electrical parts for detachably accommodating and holding an electrical part such as a semiconductor device (called as "IC package" hereinafter) and also relates to a method of assembling such socket for electrical parts.

RELATED ART OF THE INVENTION

As a conventional "socket for electrical parts" of this kind, there has been provided an IC socket for detachably accommodating and holding an IC package as "electrical part".

The IC package includes, for example, a BGA (Ball Grid Array) type of IC package in which solder balls as a number of terminals are provided to the lower surface of the package body so as to protrude downward in a grid (lattice) arrangement having vertical (Y) and horizontal (X) rows.

The IC socket is provided with a socket body, a number of contact pins disposed to the socket body so as to contact the terminals of the IC package, respectively. Furthermore, a movable member for contacting or separating the contact pins to or from the solder balls of the IC package, through elastic deformation of the contact pins, is also arranged to be vertically movable.

Furthermore, the socket body is provided with lever members to be rotatable (pivotal) about pivotal shafts so as to vertically move the movable member, and an operation member for rotating the lever members is also provided for the socket body to be vertically movable.

When this operation member is vertically moved, the lever members are rotated (pivoted), and according to this rotating motion, the movable member is vertically moved, thus contacting or separating contact portions of the contact pins to or from the solder balls of the IC package.

However, in such conventional IC package as mentioned above, a base end portion of the lever member is secured to the socket body to be rotatable through a rotation shaft and an E ring is also provided for preventing the lever member from coming off from the socket body, so that the number of elements or parts is increased and the assembling working is hence increased, thus being inconvenient and disadvantageous.

Furthermore, in order to prevent the front end portion of the lever member from falling sideways, the front end portion of the lever member is coupled to the operation member to be rotatable through a support shaft, so that, in this meaning, the number of elements or parts is increased and the assembling working is hence increased, thus being inconvenient.

SUMMARY OF THE INVENTION

An object of the present invention is to substantially eliminate defects or drawbacks encountered in the prior art mentioned above and to provide a socket for electrical parts and a method of assembling the same, by which the number of elements or parts to be utilized can be effectively reduced as well as reduction of the assembling workings.

This and other objects can be achieved according to the present invention by providing, in one aspect, a socket for electrical parts in which a number of contact pins contacting a number of terminals of an electrical part is arranged to a socket body in which the electrical parts is accommodated, an operation member is provided for the socket body to be vertically movable in an installed state, and when the operation member is vertically moved, a movable member is moved through lever members to thereby displace the contact pins to be electrically contacted to or separated from the terminals of the electrical part, wherein the socket body is formed with boss portions to which base end portions of the lever members are secured to be rotatable and the socket body is formed with guide wall sections so as to guide side portions of the base end portions of the lever members to thereby prevent the lever members from coming off from the boss portions.

In a preferred embodiment of the above aspect, the operation member is formed with guide grooves into which front end portions of the lever members are inserted so as to prevent the lever members from falling sideways.

The socket body is formed of synthetic resin, the boss portions are integrally formed with the socket body and the lever members are formed of metal material. The base end portions of the lever members are formed with holes into which the boss portions are fitted. The terminals of the electrical part are solder balls. The socket is an IC socket and the electrical part is an IC package.

In a modified aspect, there is provided a socket for electrical parts comprising:

a socket body to which an electrical part having a number of terminals is accommodated;

a number of contact pins arranged to the socket body so as to accord with the arrangement of the terminals of the electrical part;

an operation member disposed to the socket body to be vertically movable in an installed state;

lever members provided for the socket body to be rotatable in association with the vertical movement of the operation member; and a movable member disposed to the socket body to be movable in accordance with the movement of the operation member through the lever members to thereby displace the contact pins so as to contact or separate the contact pins to or from the terminals of the electrical part, the socket body being formed with boss portions, the lever members being formed with base end portions which are fitted to the boss portions to be rotatable, and the socket body being formed with guide wall sections so as to guide side portions of the base end portions of the lever members to thereby prevent the lever members from coming off from the boss portions.

In another aspect, there is also provided a method of assembling a socket for electrical parts in which a number of contact pins contacting a number of terminals of an electrical part is arranged to a socket body which accommodates the electrical part and which is provided with an operation member and a movable member which is operatively connected to the operation member through lever members, wherein the lever members are fitted to the boss portions of the socket body to be rotatable, when the lever members are rotated while being guided along guide wall sections of the socket body and the operation member is disposed to the socket body to be vertically movable.

The operation member is formed with guide grooves into which front end portions of the lever members are inserted so as to prevent the lever members from falling down sideways.

According to the present invention of the characters mentioned above, the base end portions of the lever members are fitted to the boss portions of the socket body to be rotatable and the guide wall sections are formed to the socket body so as to guide the side portions of the base end portions of the lever members to prevent the lever member from coming-off from the boss portions. Accordingly, it is not necessary to specifically locate any member for preventing the coming off of the lever members, thus reducing the number of parts or elements to be assembled and improving the assembling working of the lever members and others. Furthermore, the formation of the guide grooves eliminates the location of any member such as a support shaft for supporting the lever members.

Moreover, the socket body is formed of synthetic resin and the lever members are formed of metal material. Accordingly, the boss portions can be easily molded integrally with the socket body and the lever members can ensure the good rigidity thereof.

The nature and further characteristic features of the present invention will be made more clear from the following descriptions made with reference to the accompanying drawings.

BRIEF DESCRIPTION OF THE DRAWINGS

In the accompanying drawings:

FIG. 10 represents an IC package to be mounted on the IC socket of the present embodiment, in which

FIG. 11 represents a contact pin of the IC socket, in which FIG. 11A is a front view of the contact pin, FIG. 11B is a left side view of FIG. 11B, FIG. 11C is a plan view of FIG. 11A and FIG. 11D is a sectional view taken along the line XID—XID of FIG. 11A;

FIGS. 12A & B is a sectional view showing the state that contact portions of the contact pin of the IC socket of this embodiment are closed; and FIGS. 13A & B is a sectional view showing the state that the contact portions of the contact pin are opened.

DESCRIPTION OF THE PREFERRED EMBODIMENTS

Figure 1:
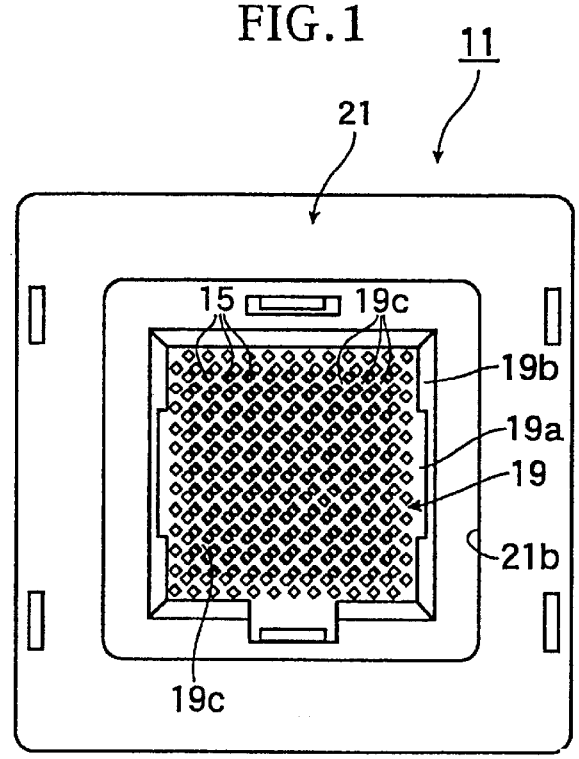
FIG. 1 is a plan view of an IC socket according to one embodiment of the present invention.

Preferred embodiments of the present invention will be described hereunder with reference to the accompanying drawings.

An IC socket as "socket for electrical parts" is totally designated by reference numeral 11, which is a device for carrying out an electrical connection between a solder ball 12b as "terminal" of an IC package 12 as "electrical parts" and a printed circuit board, not shown, of a tester, for example, for a performance test of the IC package 12.

Figures 10A, 10B:
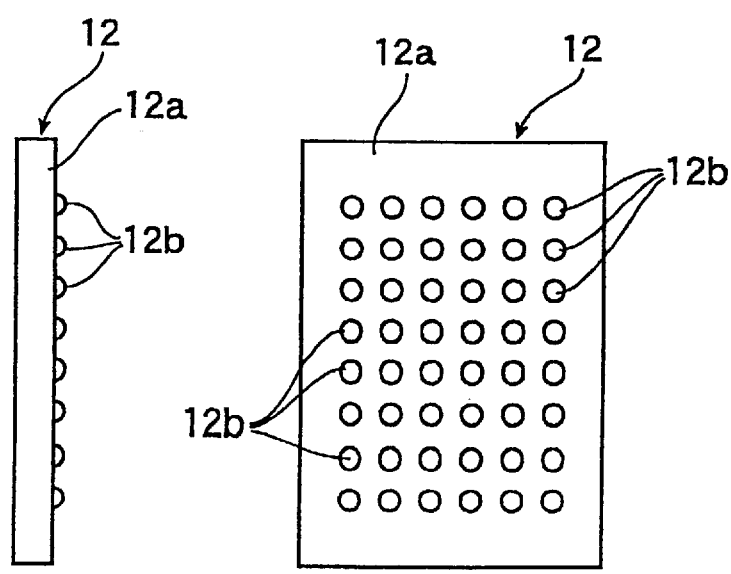
FIG. 10A is a bottom view of the IC package and FIG. 10B is a left side view of FIG. 10A.

The IC package 12 is so-called a BGA (Ball Grid Array) type as shown in FIGS. 10A and 10B, in which a number of spherical-shape solder balls 12b is arranged to the lower surface of a rectangular package body 12a in a manner projecting in matrix arrangement of vertical and horizontal rows.

Figure 2:
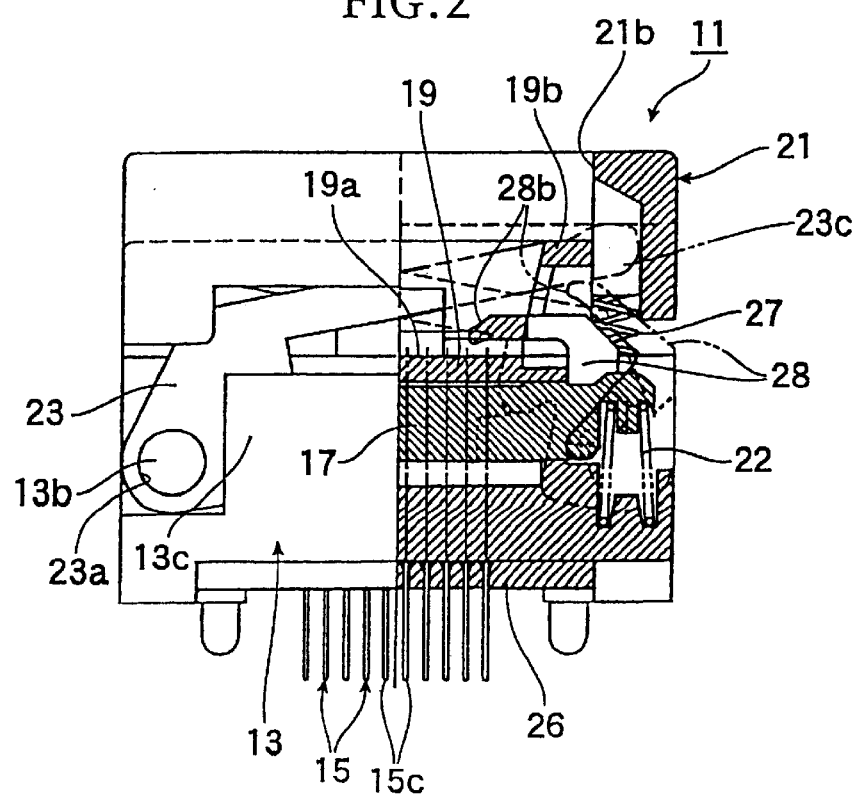
FIG. 2 is a front view of the IC socket of FIG. 1, in which a right half is shown as sectional view.

On the other hand, the IC socket 11 is generally composed of, as shown in FIG. 2, a socket body 13 formed of synthetic resin to be mounted to the printed circuit board. A number of contact pins 15, which are contacted to or separated from the solder balls 12b of the IC package 12, respectively, is provided for the socket body 13, and a movable member 17 for displacing the contact pins 15 is also provided for the socket body 13. In addition, a top plate 19 is further arranged and fixed to the socket body 13 at a position above the movable member 17. Furthermore, an operation member 21 is further provided for the socket body 13 to be vertically movable so as to vertically move the movable member 17.

Each of the contact pins 15 is formed out of a plate member having a good conductivity and elastic (springy) property through press working so as to provide a shape shown in FIG. 11 (FIGS. 11A to 11D).

More in detail, the contact pin 15 is composed of a pair of elastic pieces 15a and 15b at its upper portion and a solder tail portion 15c at its lower portion. The paired elastic pieces 15a and 15b have a common base portion 15d at lower portions thereof, as viewed in FIG. 11D, and the base portion 15d has substantially a U-shape so that the paired elastic pieces 15a and 15b are opposed to each other. A pair of contact portions 15e and 15f is further formed to the upper (front end) portions of the respective elastic pieces 15a, 15b of each contact pin 15 so as to be contacted to or separated from the side portions of the solder balls 12b, and at a time when the solder ball 12b is clamped between the contact portions 15e and 15f, an electrical connection is established between the IC package 12 and the printed circuit board, not shown, for example.

Furthermore, each of the paired elastic pieces 15a and 15b of the contact pin 15 is formed with a bent portion 15g bent in the middle at approximately a 45 angle, and these bent portions 15g are pressed by a cam portion (or cam portions) 17a, of the movable member 17 to thereby open the contact portions 15e and 15f.

Figure 3:
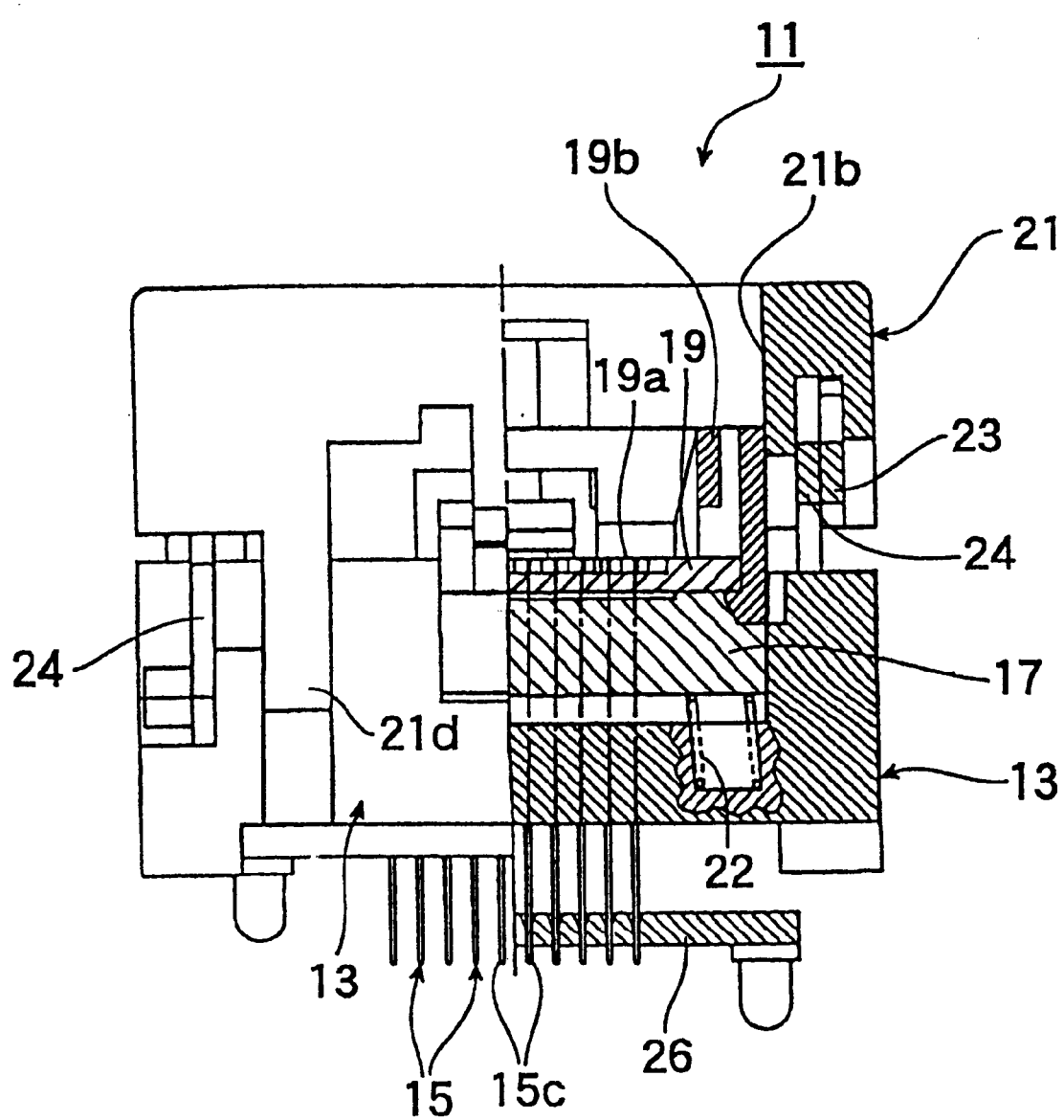
FIG. 3 is a side view of the IC socket of FIG. 1, in which a right half is shown as sectional view.

The solder tail portion 15c and the base portion 15d of the contact pin 15 of the structure mentioned above are press-fitted in a press-fit hole 13a formed to the socket body 13 as shown in FIGS. 12 and 13. Under the press-fitted state thereof, a falling prevention portion 15m formed to the base portion 15d bites the socket body 13 to thereby prevent the contact pin from falling upward. The solder tail portion 15c projecting downward from the socket body 13 further extends downward through a location board 26 as shown in FIG. 2 or 3, and then, is inserted into a through hole formed to the printed circuit board and soldered thereto, thus being connected thereto.

These contact pins 15 are arranged in the shape of matrix of a vertical and horizontal rows with the same pitch as that of the arrangement of the solder balls 12b of the IC package 12.

Figure 5:
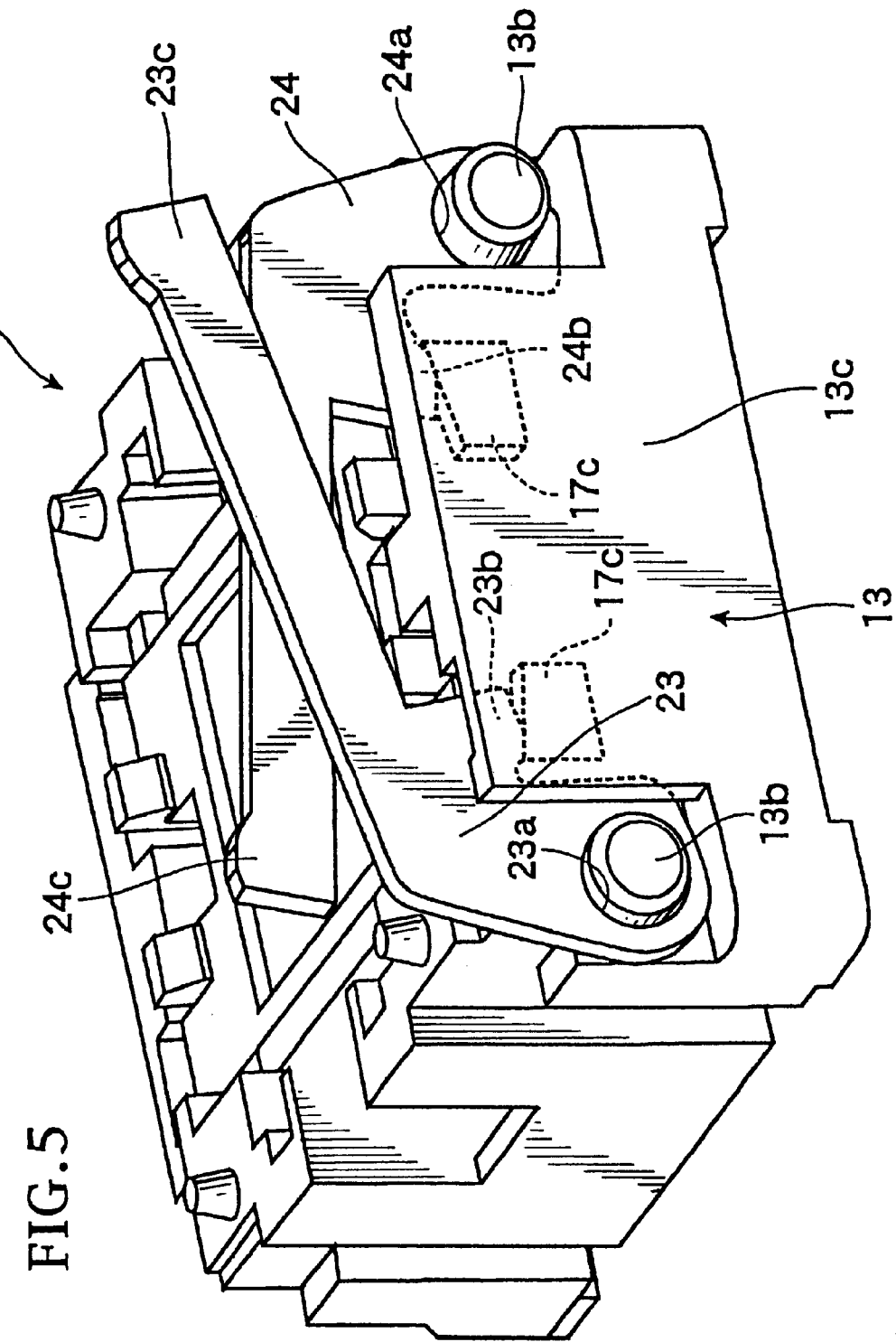
FIG. 5 is a perspective view of the IC socket of FIG. 4 with an operation member being removed.

On the other hand, the movable member 17 is disposed to the socket body 13 to be vertically movable with respect thereto, and that is, movable in a direction perpendicular to a mount surface 19a of the top plate 19 and urged upward by means of spring 22. Each set of first and second lever members (levers) 23 and 24 for vertically moving the movable member 17 is disposed on right and left lateral sides of the socket body 13. In FIG. 5, only one set of the lever members 23 and 24 is described.

These first and second lever members 23 and 24 are made of metal and have base end portions to which fit-holes 23a and 24a are formed, and bosses 13b formed integrally with the synthetic resin made socket body 13 are fitted to these holes 23a and 24a to be rotatable. Both the lever members 23 and 24 are arranged in X-shape as shown in FIG. 5.

The base end sides of the first and second lever members 23 and 24 are formed with press portions 23b and 24b abutting against the upper surfaces of portion 17c to be pressed by the movable member 17 and depressing the surface downward. Furthermore, the socket body 13 is formed with guide walls 13c for guiding side portions of the base end portions of the first and second lever members 23 and 24 so as to prevent both the lever members 23 and 24 from coming off the bosses 13b.

Figure 4:
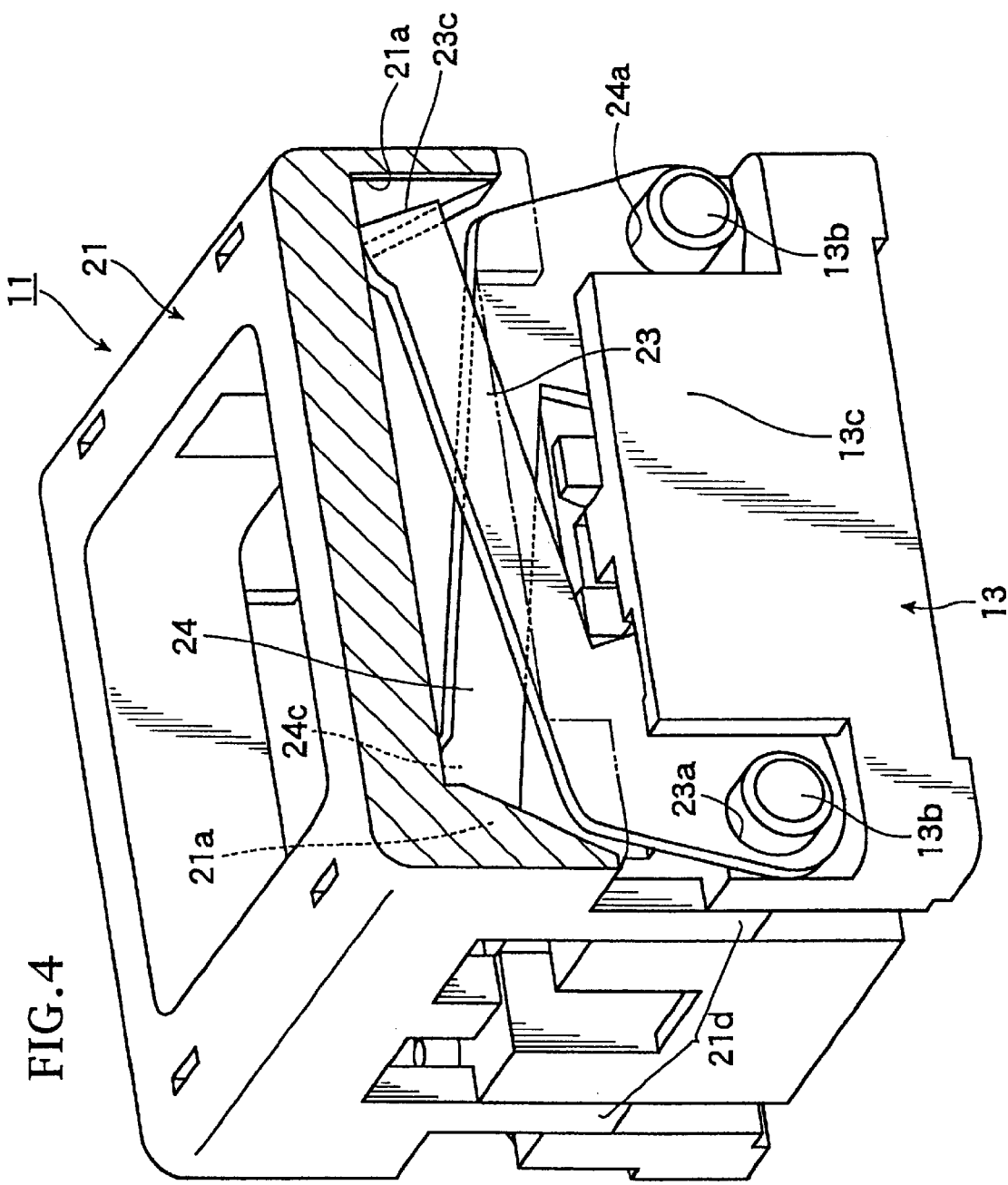
FIG. 4 is a perspective view, partially in section, of the IC socket of the above embodiment.
Figure 6:
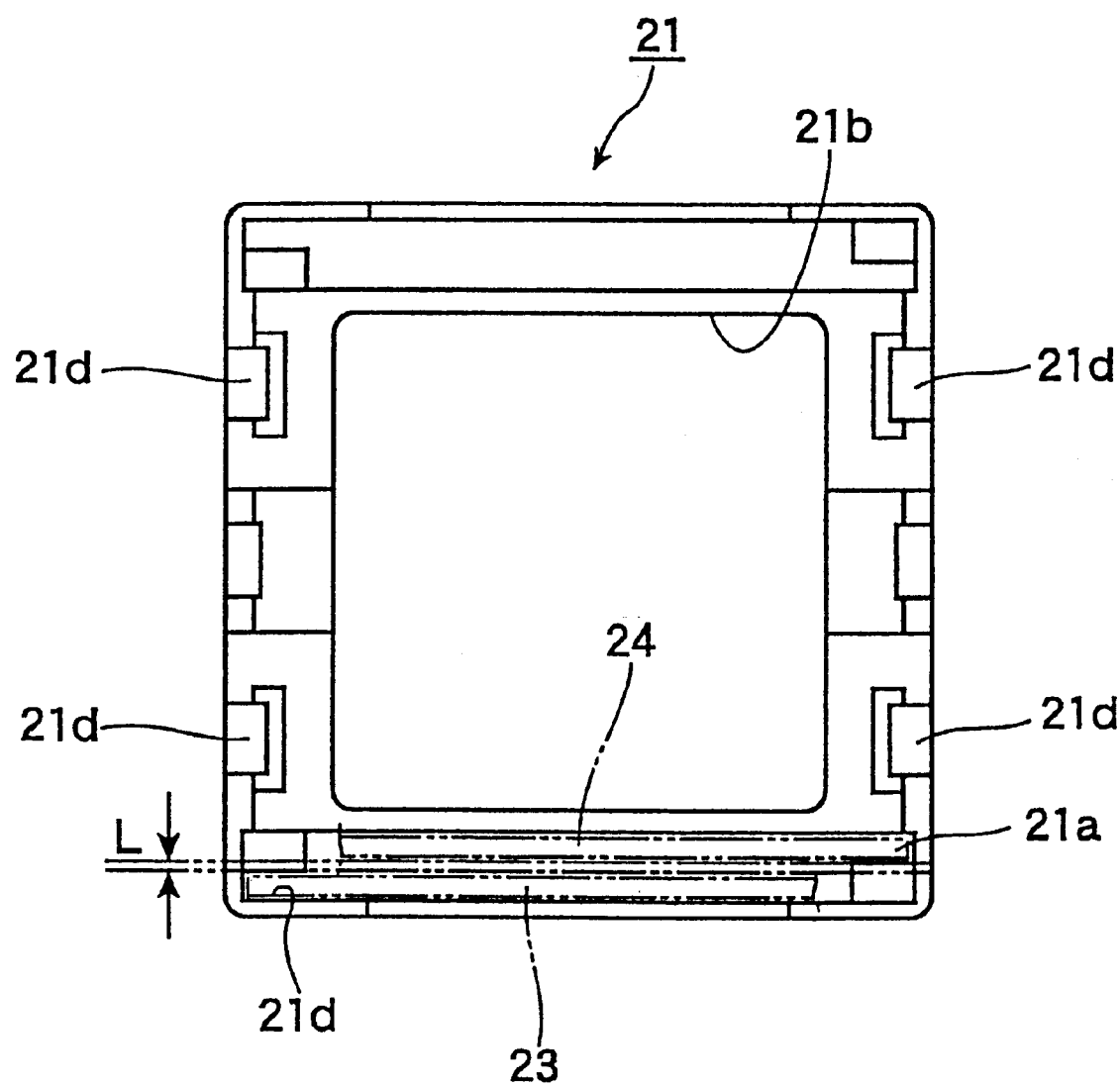
FIG. 6 is a backside view of the operation member of the IC socket of this embodiment.

Moreover, front end portions 23c and 24c of the first and second lever members 23 and 24 are inserted into guide grooves 21a formed to the rear surface of the operation member 21, as shown in FIG. 4, to thereby guide the front end portions 23c and 24c and prevent them from falling sideways. The paired guide grooves 21a have a distance L therebetween, as shown in FIG. 6, so that the lever member 23 and 24 do not contact each other.

According to the described structures, when the operation member 21 is moved downward, both the lever members 23 and 24 are rotated, through which the movable member 17 is also lowered.

Then, with reference to FIGS. 12 and 13, the movable member 17 has cam portions 17a each disposed to adjacent two contact pins 15, and the cam portion 17a has, at its both sides, sliding surfaces 17b. These sliding surfaces 17b press the bent portions 15g of the elastic pieces 15a, 15b of the contact pins 15 which contact the sliding surfaces 17b of both the side portions of the cam portion 17a. That is, one cam portion 17a presses both the bent portions 15g of the elastic pieces 15a, 15b of the contact pins 15 each disposed to each of both sides of the cam portion 17a, and hence, the bent portions 15g of the paired elastic pieces 15a, 15b of one contact pin 15 are pressed by a pair of cam portions 17a disposed on both sides of this one contact pin 15 in a direction approaching each other, thus the contact portions 15e and 15f being opened (separated from each other).

On the other hand, as shown in FIGS. 1 and 3, the top plate 19 has the mount surface portion 19a on which the IC package 12 is mounted and is provided with a guide portion 19b for positioning the IC package 12 to the predetermined position so as to correspond to the peripheral edge portion of the package body 12a. Furthermore, the top plate 19 is also provided, as shown in FIG. 12, with positioning ribs 19c each to be inserted into a space between the paired contact portions 15e and 15f of the contact pin 15. The positioning rib 19c takes a state clamped between both the elastic pieces 15a and 15b in the closed state (i.e. a state that no external force is applied to the elastic pieces) of both the contact portions.

In the meantime, as shown in FIG. 1, the operation member 21 has an opening 21b having a size capable of inserting the IC package 12, which is inserted through this opening 21b and mounted on the predetermined position on the mount surface portion 19a of the top plate 19. This operation member 21 is arranged to be vertically movable with respect to the socket body 13 and urged upward by means of spring 27. The operation member 21 is prevented from coming off at its uppermost position (most rising position) through the engagement between the engaging member 21d in the shape of a claw with the engagement portion of the socket body 13.

Furthermore, the operation member 21 is formed with an operating portion, not shown, for rotating the latch 28. The latch 28 is mounted to the socket body 13 to be rotatable about its axis and is urged by a spring, not shown, in a direction for closing the latch 28 so as to press the peripheral edge portion of the IC package 12 by the press portion 28b formed to a front end portion of the latch 28b.

The latch 28 is further formed with a portion to be pressed (pressed portion), not shown, on which the operating portion of the operation member 21 is slid, and when the operation member 21 is lowered, the operating portion thereof is slid on the pressed portion of the latch 28 so that the latch 28 can be rotated in the clockwise direction shown with two-dot-chain line in FIG. 2 and the press portion 28b is hence retired from the setting position of the IC package 12.

Hereunder, the assembling steps or processes of the IC socket of the structure mentioned above will be described.

Figure 7:
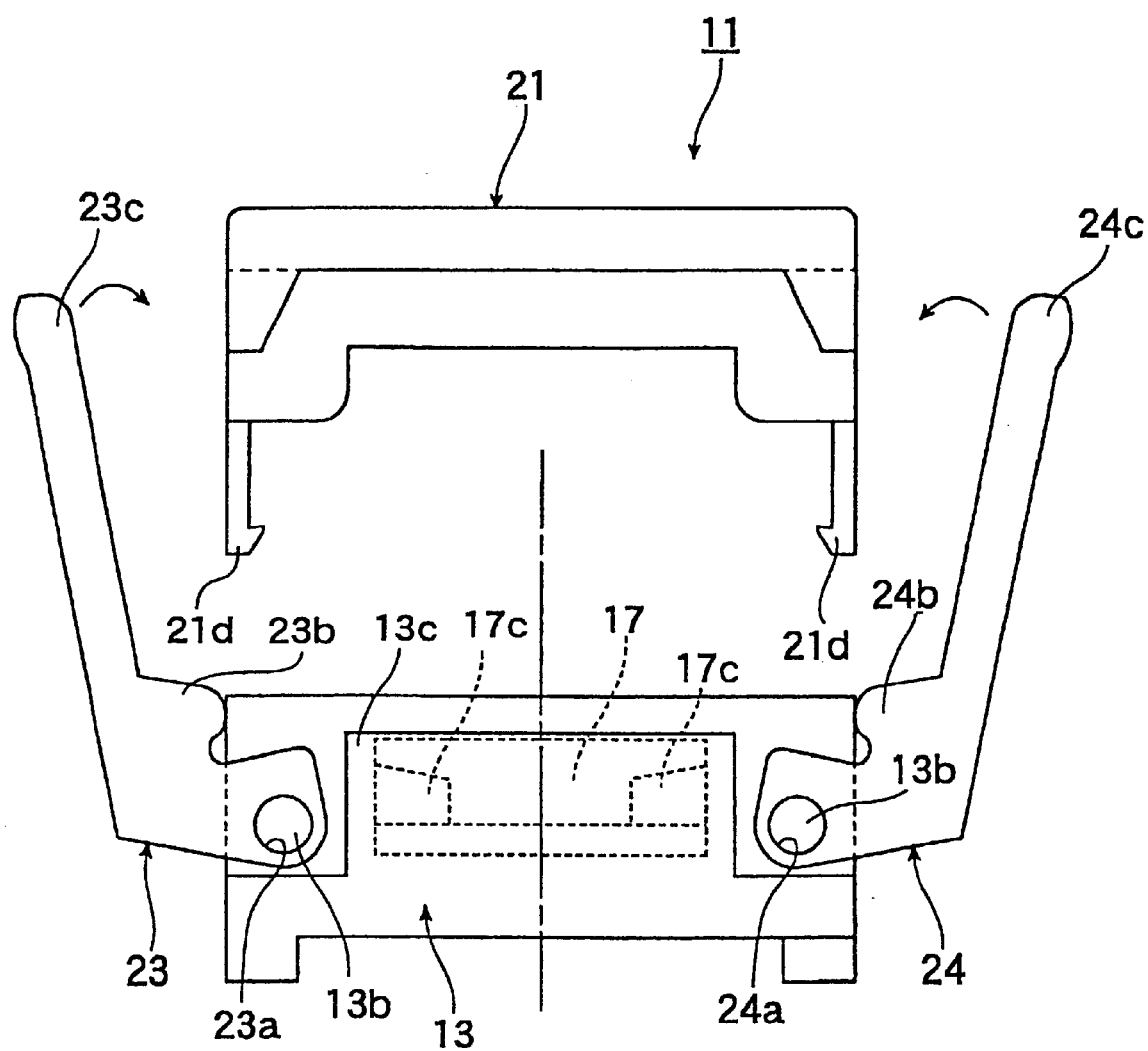
FIG. 7 is a developed front view of the IC socket showing an assembling process thereof.

The lever members 23 and 24 are mounted to the socket body 13 in a state that the bosses 13b of the socket body 13 are fitted to the fit-holes 23a and 24a of the lever members 23 and 24 to be rotatable with the standing attitude thereof as shown in FIG. 7. Thereafter, these lever members 23 and 24 are rotated, i.e. tilted, in an arrowhead direction in FIG. 7 so that the side surfaces of the lever members slide along the guide wall sections 13c of the socket body 13. In this state, the coming-off of the lever members 23 and 24 from the bosses 13b can be prevented.

Accordingly, since the bosses 13b are formed integrally with the socket body 13, it is not necessary to additionally assemble a rotational shaft or the like member, and moreover, it is also not necessary to arrange a member such as an E ring to prevent the lever members from coming off, thus advantageously reducing the number of elements or parts for the assembly and reducing assembling working steps.

Thereafter, the operation member 21 is mounted with the spring 27 being located to the socket body 13, and at this time, the front end portions 23c and 24c of the lever members 23 and 24 are inserted into the guide grooves 21a of the operation member 21, and the engaging claw 21d of the operation member 21 is engaged with the engagement portion of the socket body 13. According to such arrangement, the operation member 21 is mounted to the socket body while limiting its upper end position during the vertical movement thereof.

As mentioned above, the falling of the lever members 23 and 24 can be prevented only by inserting the front end portions 23c and 24c thereof into the guide grooves 21a of the operation member 21, and moreover, the contacting of these lever members 23 and 24 can be also prevented by the location of the distance L between the grooves 21a.

Accordingly, it is not necessary, as in the conventional technology, to support the lever members to the operation member to be rotatable by means of a support shaft, thus advantageously reducing the number of elements or parts for the assembly and reducing the assembling working steps.

The IC socket of the structures and characters mentioned above will be utilized in the following ways.

Figure 8:
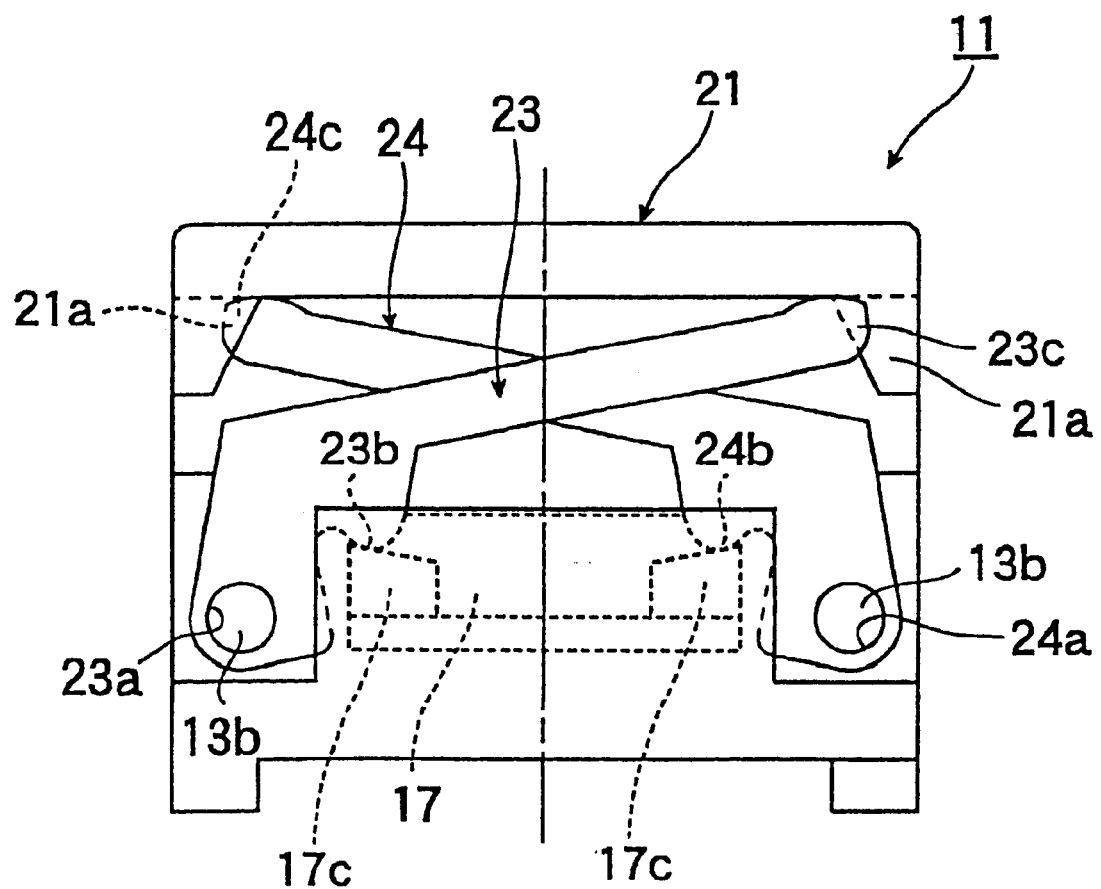
FIG. 8 is a front view of the IC socket in which the operation member is moved to its uppermost position.
Figure 9:
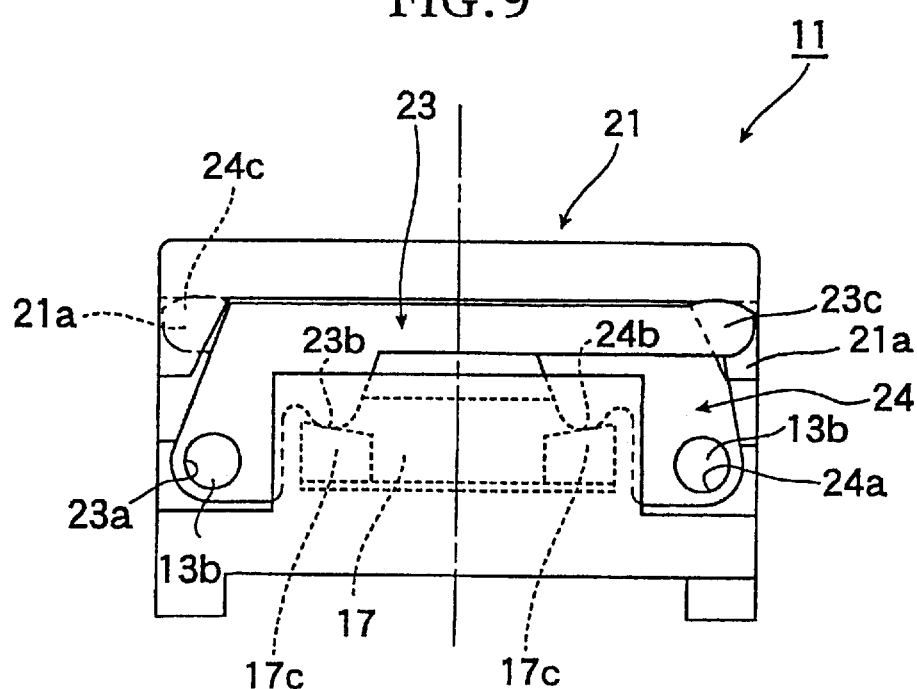
FIG. 9 is a front view of the IC socket in which the operation member is moved down to its lowermost position.

At a time when the IC package 12 is set to the IC socket 11, the operation member 21 is first depressed downward. Then, the front end portions 23c and 24c of the lever members 23 and 24 are pressed downward and thereby rotated downward from the state shown in FIG. 8 to the state shown in FIG. 9 with the boss 13b of the socket body 13 being the center of the rotation. Accordingly, the portion (to be pressed) 17c of the movable member 17 is pressed by the press portions 23b and 24b of the respective lever members 23 and 24 and, then, the movable member 17 is moved downward against the urging force of the spring 22 shown in FIG. 3. According to this lowering motion of the movable member 17, the cam portions 17a are also lowered as shown in FIGS. 12 and 13, and both the bent portions 15g of the elastic pieces of the contact pins 15 are pressed by the sliding surfaces 17b of the cam portions 17a, thus the paired contact portions 15e and 15f being opened as shown in FIG. 13.

At the same time, the portion (to be pressed) of the latch 28 is pressed by the operating portion of the operation member 21 to be thereby rotated from the solid line position to the two-dot-chain line position in FIG. 2 against the urging force of the spring in the opening direction thereof, and thus, the pressing portion 28b of the latch 28 is displaced to the retiring position.

Under the state mentioned above, the IC package 12 is guided and set to the predetermined position on the mount surface portion 19a of the top plate 19, and in this state, the respective solder balls 12b of the IC package 12 are inserted, in non-contact state, in the opened space between the paired contact portions 15e and 15f of the contact pins 15, respectively, as shown in FIG. 13B.

Thereafter, when the downward pressing force to the operation member 21 is released, the operation member 21 is moved upward by the urging force of the spring 27 and so on, and the movable member 17 is also moved upward by the spring 22. Simultaneously, the latch 28 is rotated in the direction for closing the latch 28 by the urging force of the spring.

Next, when the movable member 17 is moved upward, the pressing force of the cam portions 17a to the bent portions 15g of the contact pins 15 are released, and the paired contact portions 15e and 15f are moved to their closing direction from the state shown in FIG. 13 to thereby clamp the solder ball 12b therebetween.

According to the operation mentioned above, the solder balls 12b of the IC package 12 and the printed circuit board are electrically connected through the contact pins 15.

On the other hand, at a time when the IC package 12 is dismounted from the IC socket 11, the operation member 21 is lowered, the contact portions 15e and 15f are separated from the solder ball 12b, and accordingly, the IC package 12 can be easily removed with a force smaller than that required for pulling out each of the solder balls 12b from the state clamped by the paired contact portions 15e and 15f.

During the operation periods mentioned above, the lever members 23 and 24 are guided by the guide wall sections 13c of the socket body 13, so that the lever members 23 and 24 can be prevented from coming off. That is, in the assembling state of the IC socket 11, since the lever members 23 and 24 are rotatable (pivotal) within the range of the vertical stroke of the operation member 21, the guide wall sections 13c are formed to be capable of guiding the lever members 23 and 24 in the this pivotal range (usable range). Moreover, the size (area) of the guide wall sections 13c are set to enable the lever members 23 and 24 to be removed from the bosses 13b in the range out of the usable range.

Furthermore, since the front end portions 23c and 24c of the lever members 23 and 24 are inserted into the guide grooves 21a of the operation member 21 to be guided thereby, the lever members 23 and 24 can be prevented from falling and being contacted to each other, thus preventing friction therebetween.

Further, it is to be noted that the present invention is not limited to the described embodiment and many other changes, modifications and alternations may be made without departing from the scopes of the appended claims.

That is, in the embodiment described above, although the present invention is applied to the IC socket 11 as "socket for electrical parts", the present invention is not limited to such an IC socket and is applicable to other devices or like. Moreover, the present invention is applied to the IC socket for the BGA type IC package 12, but it is not limited thereto and applicable to an IC socket for an PGA (Pin Grid Array) type IC package. Furthermore, in the described embodiment, although a pair of elastic pieces 15a and 15b are formed to the contact pin 15, only one elastic piece may be formed to the contact pin 15.

What is claimed is:

1. A socket for electrical parts, comprising a number of contact pins contacting a number of terminals of an electrical part and being arranged on a socket body which receives the electrical part, an operation member provided on the socket body to be vertically movable in an installed state, and when the operation member is vertically moved, a movable member is moved through lever members to thereby displace the contact pins to be electrically contacted to or separated from the terminals of the electrical part, wherein each said lever member has a base end portion rotatably mounted to the socket body, a front end portion for contacting the operation member, and a press portion to press the movable member, and said socket body is formed on an outside surface thereof with boss portions to which said base end portions of said lever members are rotatably mounted, and said socket body is formed with guide wall sections spaced from each boss portion in a substantially perpendicular direction to an axial direction of the boss portions, so as to guide side portions of the base end portions of the lever members and prevent the lever members from coming off of the boss portions.

2. A socket for electrical parts according to claim 1, wherein said operation member is formed with guide grooves into which front end portions of the lever members are inserted so as to prevent the lever members from moving sideways.

3. A socket for electrical parts according to claim 1, wherein said socket body is formed of synthetic resin, said boss portions are integrally formed with the socket body and said lever members are formed of metal material.

4. A socket for electrical parts according to claim 1, wherein said base end portions of the lever members are formed with holes into which said boss portions are fitted.

5. A socket for electrical parts according to claim 1, wherein said terminals of the electrical part are solder balls.

6. A socket for electrical part according to claim 1, wherein said socket is an IC socket and said electrical part is an IC package.

7. A socket for electrical parts according to claim 1, wherein the movable member moves vertically with respect to the socket body.

8. A socket for electrical parts according to claim 7, wherein the movable member has a cam portion, the cam portion being formed with a sliding surface which displaces the contact pin to be electrically contacted to or separated from the terminal of the electrical part in association with the vertical movement of the movable member.

9. A socket for electrical parts according to claim 1, wherein the outside surface is a lateral side of the socket body.

10. A socket for electrical parts according to claim 9, wherein the lever members are a pair of lever members in an X-shape.

11. A socket for electrical parts according to claim 10, wherein another pair of lever members is disposed on another lateral side opposite to the lateral side of the socket body.

12. A socket for electrical parts according to claim 10, wherein the front end portions of the pair of lever members are separately inserted into a pair of guide grooves respectively formed at a rear surface of the operation member so that the lever members are prevented from contacting each other.

13. A socket for electrical parts, comprising:

a socket body which receives an electrical part having an arrangement of a plurality of terminals;

a number of contact pins arranged on the socket body corresponding to the arrangement of said terminals of the electrical part;

an operation member provided on the socket body to be vertically movable in an installed state;

lever members provided on the socket body to be rotatable in association with the vertical movement of said operation member, said lever member having a base end portion rotatably mounted to the socket body, a front end portion for contacting the operation member, and a press portion to press a movable member disposed on the socket body to be movable in accordance with the movement of the operation member through the lever members to thereby displace the contact pins so as to contact or separate the contact pins to or from the terminals of the electrical part, and said socket body being formed on an outside surface thereof with boss portions, said base end portions are rotatably fitted to the boss portions, and said socket body is formed with guide wall sections spaced from each boss portion in a substantially perpendicular direction to an axial direction of the boss portions, so as to guide side portions of the base end portions of the lever members and prevent the lever members from coming off of the boss portions.

\* \* \* \* \*